(12) United States Patent
Demuynck et al.

(10) Patent No.: US 9,651,209 B2
(45) Date of Patent: May 16, 2017

(54) MODULAR DRIVER MODULE FOR LIGHT FIXTURES WITH LED LUMINAIRES

(71) Applicant: Cree, Inc., Durham, NC (US)

(72) Inventors: Randy Demuynck, Wake Forest, NC (US); James Michael Lay, Apex, NC (US)

(73) Assignee: Cree, Inc., Durham, NC (US)

( * ) Notice: Subject to any disclaimer, the term of this patent is extended or adjusted under 35 U.S.C. 154(b) by 541 days.

(21) Appl. No.: 14/044,493

(22) Filed: Oct. 2, 2013

(65) Prior Publication Data

US 2015/0092449 A1 Apr. 2, 2015

(51) Int. Cl.

| F21S 8/04 | (2006.01) |
| F21V 23/06 | (2006.01) |
| F21V 23/00 | (2015.01) |
| F21V 29/508 | (2015.01) |
| H01R 31/06 | (2006.01) |
| H01R 33/94 | (2006.01) |
| H05B 33/08 | (2006.01) |
| F21S 8/00 | (2006.01) |

(Continued)

(52) U.S. Cl.
CPC ............... *F21S 8/046* (2013.01); *F21K 9/20* (2016.08); *F21S 8/036* (2013.01); *F21S 8/043* (2013.01); *F21V 23/008* (2013.01); *F21V 23/06* (2013.01); *F21V 29/508* (2015.01); *H01R 31/065* (2013.01); *H01R 33/94* (2013.01); *H05B 33/0803* (2013.01); *H05B 33/0815* (2013.01); *H05B 33/0845* (2013.01); *F21K 9/23* (2016.08); *F21K 9/232* (2016.08); *F21W 2121/00* (2013.01); *F21Y 2101/00* (2013.01); *F21Y 2105/10* (2016.08); *F21Y 2113/13* (2016.08); *F21Y 2115/10* (2016.08); *H01L 2224/48091* (2013.01); *H01L 2224/48247* (2013.01); *H01L 2924/181* (2013.01)

(58) Field of Classification Search
CPC ........ F21V 23/06; F21V 23/008; F21V 17/18; H01R 33/94
See application file for complete search history.

(56) References Cited

U.S. PATENT DOCUMENTS

2008/0192508 A1* 8/2008 Busby .................... A47B 97/00
362/647
2009/0258524 A1* 10/2009 McEnery .................. F21S 8/02
439/334

(Continued)

*Primary Examiner* — Anh Mai
*Assistant Examiner* — Zachary J Snyder
(74) *Attorney, Agent, or Firm* — Withrow & Terranova, P.L.L.C.

(57) ABSTRACT

A driver module is configured to generate the drive signals necessary to drive an LED or an array of LEDs of one or more LED luminaires. The driver module may, but need not, be located remotely from the LED luminaires. Since the driver module provides the drive signals, the LED luminaires do not need to have their own driver electronics, and as such, can be rendered in a more aesthetically pleasing and cost effective manner. As an example, the driver module may be located within a junction box or escutcheon plate associated with a light fixture and the LED luminaires can be mounted in the existing sockets of the light fixture. The internal wiring of the light fixture may be used to carry the drive signals provided by the driver module to the LED luminaires via the sockets of the light fixture.

46 Claims, 15 Drawing Sheets

(51) Int. Cl.
*F21K 9/20* (2016.01)
*F21W 121/00* (2006.01)
*F21Y 101/00* (2016.01)
*F21Y 105/10* (2016.01)
*F21K 9/23* (2016.01)
*F21K 9/232* (2016.01)
*F21Y 115/10* (2016.01)
*F21Y 113/13* (2016.01)

(56) References Cited

U.S. PATENT DOCUMENTS

| | | | | |
|---|---|---|---|---|
| 2012/0091894 | A1* | 4/2012 | Chuang | F21K 9/1355 |
| | | | | 315/112 |
| 2012/0326623 | A1* | 12/2012 | Fatt | H01R 13/6675 |
| | | | | 315/291 |
| 2014/0172354 | A1* | 6/2014 | Chu | G01S 5/0231 |
| | | | | 702/150 |

* cited by examiner

MODULAR DRIVER MODULE FOR LIGHT FIXTURES WITH LED LUMINAIRES

FIELD OF THE DISCLOSURE

The present disclosure relates to LED-based lighting, and in particular to a modular driver module for light fixtures with LED luminaires.

BACKGROUND

In recent years, a movement has gained traction to replace incandescent light bulbs with light fixtures that employ more efficient lighting technologies as well as to replace relatively efficient fluorescent light fixtures with lighting technologies that produce a more pleasing, natural light. One such technology that shows tremendous promise employs light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based light fixtures are also very efficient, but are capable of producing light that is much more natural and more capable of accurately rendering colors. As a result, light fixtures that employ LED technologies are expected to replace incandescent and fluorescent bulbs in residential, commercial, and industrial applications.

However, there is a tremendous infrastructure in place for incandescent lighting. This infrastructure includes recessed lighting fixtures, ceiling lights, chandeliers, wall sconces, track lighting fixtures, standalone lamps, and the like, which are specifically designed to receive and use incandescent light bulbs. Accordingly, there is a need for an efficient and economical way to allow these fixtures to use LED-based luminaires as opposed to incandescent light bulbs.

SUMMARY

The present disclosure relates to a driver module, which is configured to generate the drive signals necessary to drive an LED or an array of LEDs of one or more LED luminaires. The driver module may, but need not, be located remotely from the LED luminaires. Since the driver module provides the drive signals, the LED luminaires do not need to have their own driver electronics, and as such, can be rendered in a more aesthetically pleasing and cost effective manner. As an example, the driver module may be located within a junction box or escutcheon plate associated with a light fixture and the LED luminaires can be mounted in the existing sockets of the light fixture. The internal wiring of the light fixture may be used to carry the drive signals provided by the driver module to the LED luminaires via the sockets of the light fixture. Alternatively, the driver module may be associated with its own sockets, which receive the drive signals. The driver module may drive the LED luminaires with one or more drive signals wherein one drive signal is used to drive multiple luminaires or each luminaire is driven with a dedicated drive signal.

The driver module may have a housing with an internal cavity in which driver module electronics reside. The driver module electronics receive AC input and generate the drive signals that are needed to drive the one or more LED luminaires. In one embodiment, the housing is configured to receive one more adapters. An AC adapter may be used to facilitate electrical connections between AC wiring or the like and the driver module. The drive adapter may be used to facilitate electrical connections between the driver module and a light fixture in which the LED luminaires are mounted. For example, the AC adapter may have an AC input mechanism on one side and a snap-fit connector on another side. The snap-fit connector is configured to releasably attach to a counter (or complementary) snap-fit connector on the housing of the driver module.

Both the driver module's housing and the AC adapter will have complementary AC contacts, which will contact each other when the AC adapter is in place. The AC output contacts of the AC adapter are electrically coupled to the AC input mechanism. As such, an AC source may be readily coupled to the AC adapter via the AC input mechanism, and the AC input is passed to the corresponding AC input contacts on the driver module's housing. The driver module electronics are coupled to the AC input contacts and powered by the AC input. The AC input mechanism may be an Edison-style base, a GU-style base, wiring terminals, wires that extend from the housing, or the like.

Similarly, the drive adapter may have a drive output mechanism on one side and a snap-fit connector on another side. The snap-fit connector is configured to releasably attach to a counter (or complementary) snap-fit connector on the housing of the driver module. Both the driver module's housing and the drive adapter will have complementary drive contacts, which will contact each other when the drive adapter is in place. The drive input contacts of the drive adapter are electrically coupled to the drive output mechanism. As such, a light fixture or the like may be readily electrically coupled to the drive adapter via the drive output mechanism. The drive signal provided by the driver module electronics may be passed to the corresponding drive input contacts of the AC adapter via the AC output contacts of the driver module's housing.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the present disclosure.

Figure 9A:
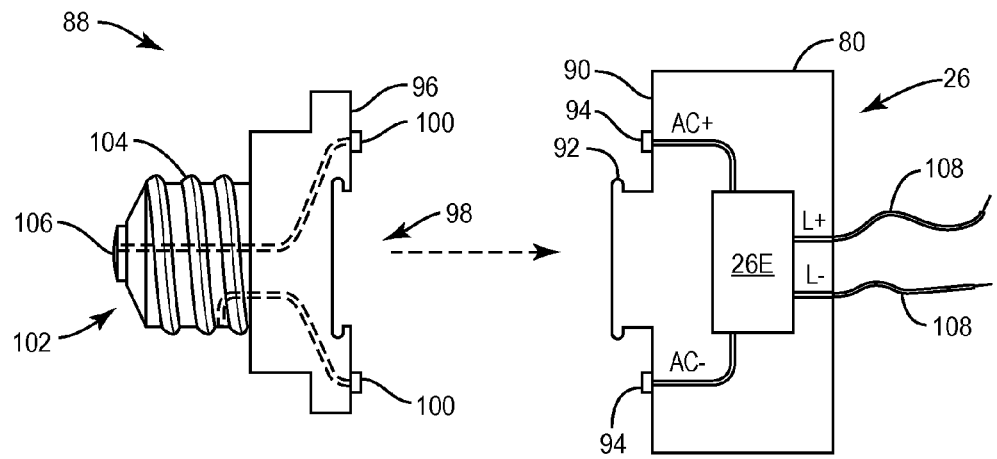
Figure 9B:
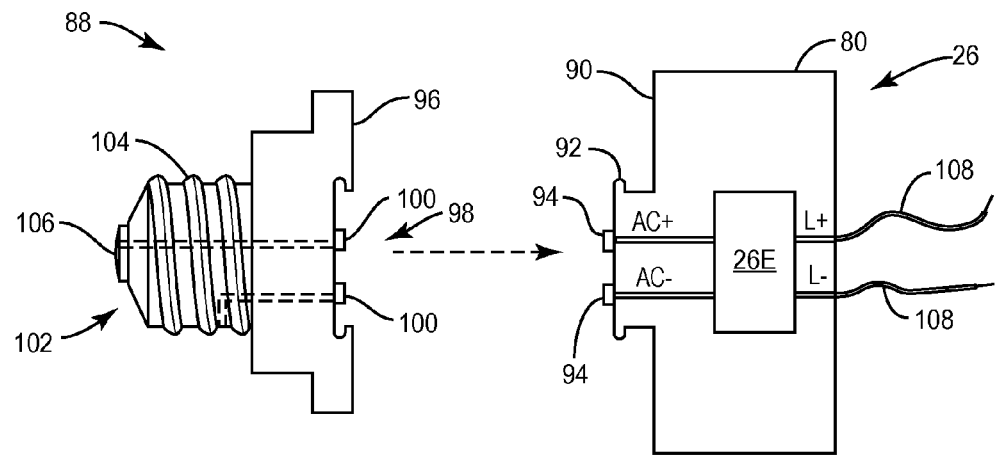
Figure 9C:
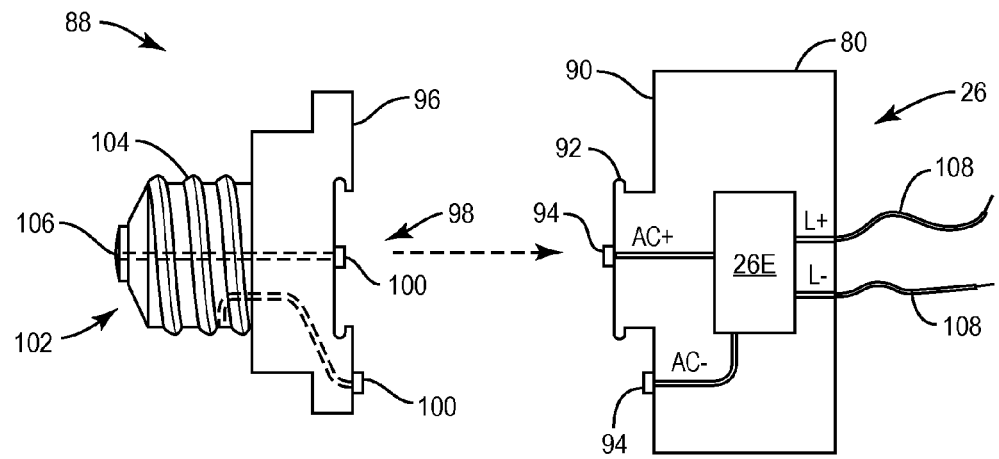

FIGS. 9A, 9B, and 9C illustrate an AC adapter and different AC output contact positions for the AC adapter according to one embodiment of the present disclosure.

FIGS. 10A through 10D illustrate alternative AC adapter configurations.

Figure 11A:
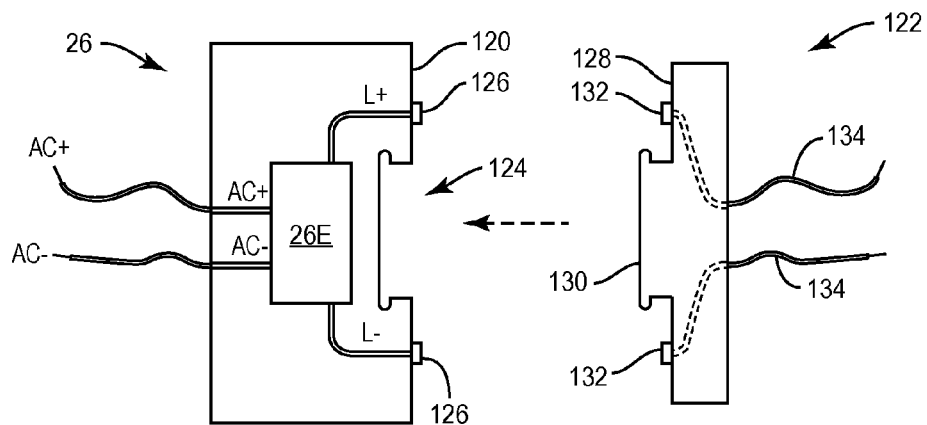
Figure 11B:
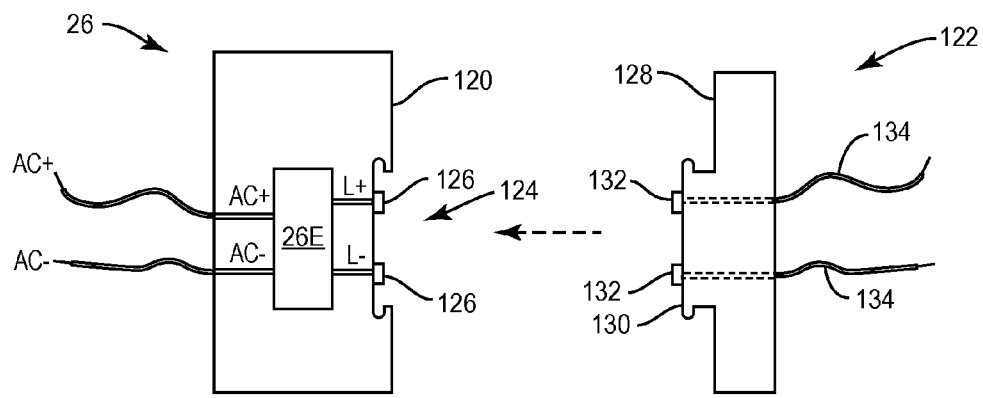
Figure 11C:
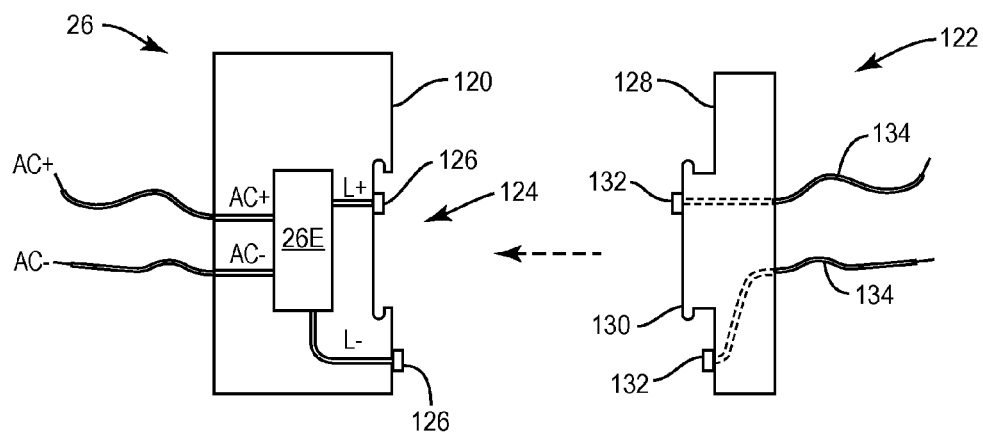

FIGS. 11A, 11B, and 11C illustrate a drive adapter and different AC input contact positions for the drive adapter according to one embodiment of the present disclosure.

Figure 12:
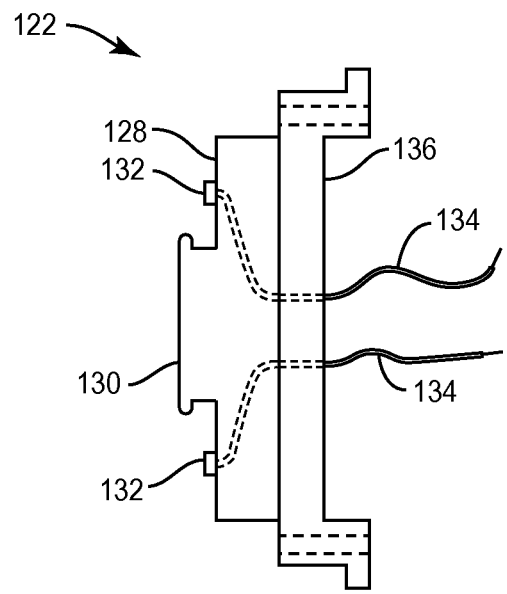

FIG. 12 is a drive adapter with a mounting bracket according to one embodiment of the present disclosure.

Figure 13:
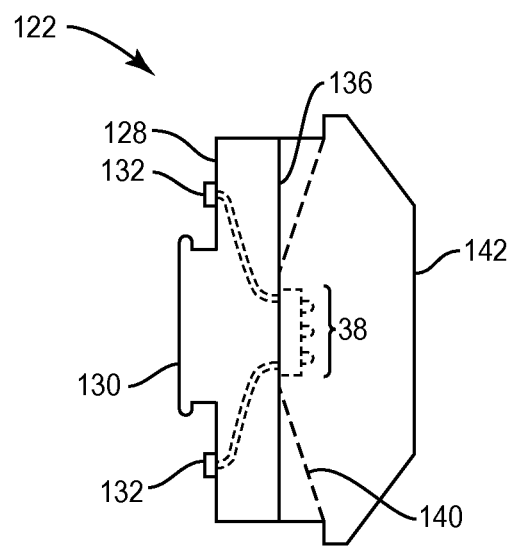

FIG. 13 is a drive adapter with an integrated LED luminaire according to one embodiment of the present disclosure.

Figure 14:
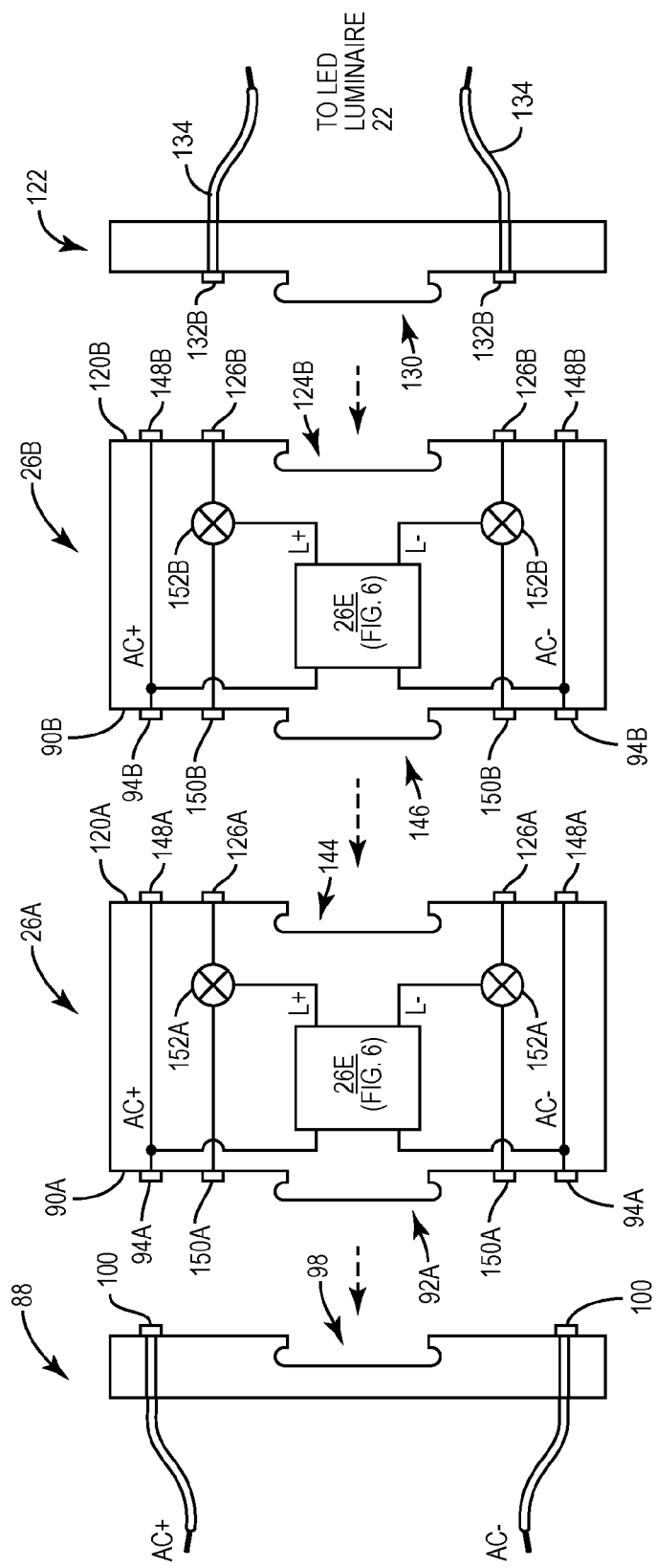

FIG. 14 is a schematic representation of stacked driver modules according to one embodiment of the present disclosure.

Figure 15:
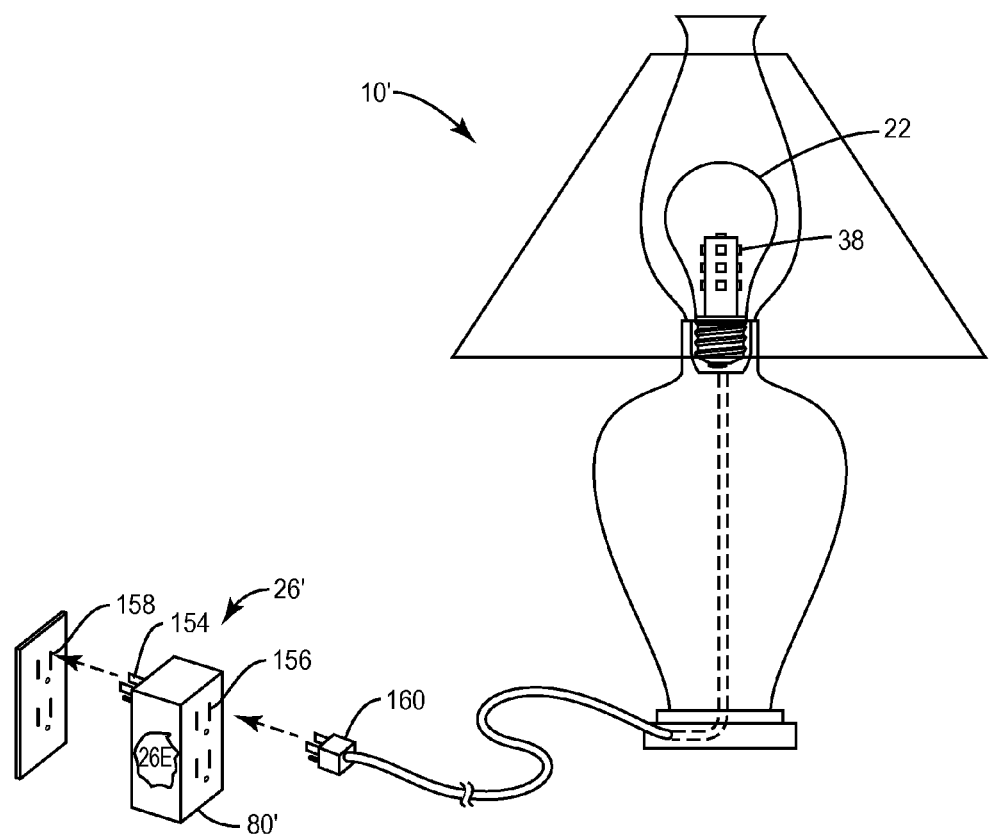

FIG. 15 is a driver module configured according to an alternative embodiment.

Figure 16:
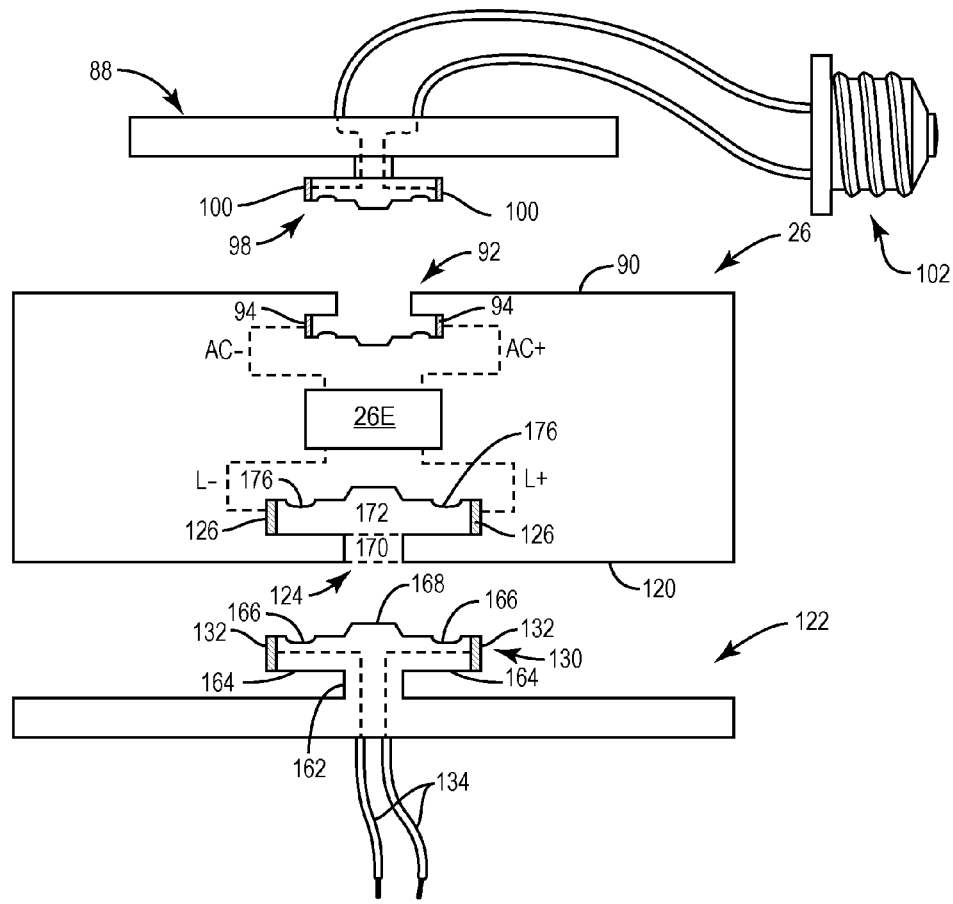

FIG. 16 is a driver module, AC adapter, and drive adapter with a snap-fit connector assembly according to a particular embodiment of the present disclosure.

Figure 17:
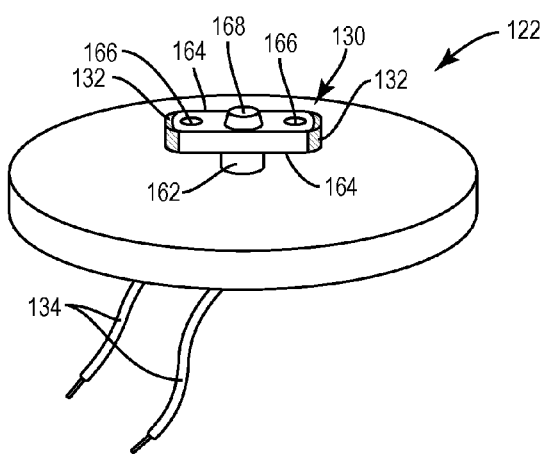

FIG. 17 is a perspective view of the drive adapter of FIG. 16.

Figure 18:
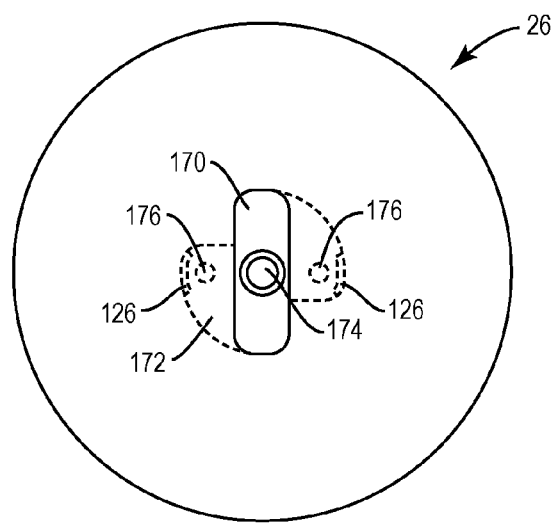

FIG. 18 is a bottom view of the driver module of FIG. 16.

Figure 19:
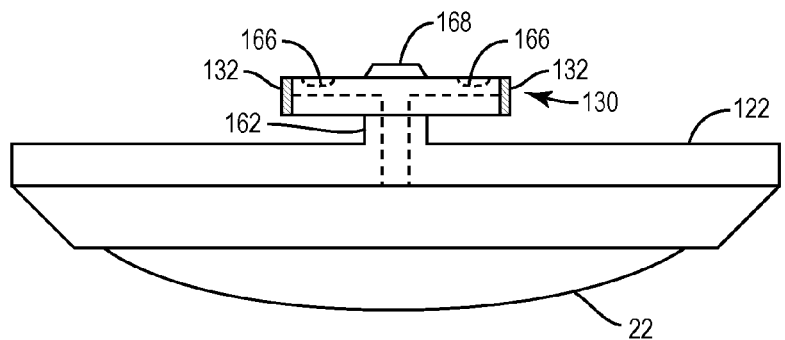

FIG. 19 is side view of a drive adapter that forms part of an LED luminaire and is compatible with the driver module of FIG. 16.

Figure 20:
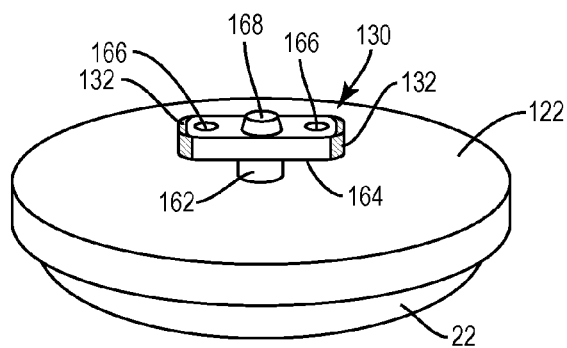

FIG. 20 is a perspective view of the drive adapter of FIG. 19.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a driver module, which is configured to generate the drive signals necessary to drive an LED or an array of LEDs of one or more LED luminaires. The driver module may, but need not, be located remotely from the LED luminaires. Since the driver module provides the drive signals, the LED luminaires do not need to have their own driver electronics, and as such, may be rendered in a more aesthetically pleasing and cost effective manner. As an example, the driver module may be located within a junction box or escutcheon plate associated with a light fixture and the LED luminaires may be mounted in the existing sockets of the light fixture. The internal wiring of the light fixture may be used to carry the drive signals provided by the driver module to the LED luminaires via the sockets of the light fixture.

The driver module may have a housing with an internal cavity in which driver module electronics reside. The driver module electronics receive AC input and generate the drive signals that are needed to drive the one or more LED luminaires. In one embodiment, the housing is configured to receive one more adapters. An AC adapter may be used to facilitate electrical connections between AC wiring or the like and the driver module. A drive adapter may be used to facilitate electrical connections between the driver module and a light fixture in which the LED luminaires are mounted. For example, the AC adapter may have an AC input mechanism on one side and a snap-fit connector on another side. The snap-fit connector is configured to releasably attach to a counter (or complementary) snap-fit connector on the housing of the driver module.

Both the driver module's housing and the AC adapter will have complementary AC contacts, which will contact each other when the AC adapter is in place. The AC output contacts of the AC adapter are electrically coupled to the AC input mechanism. As such, an AC source may be readily coupled to the AC adapter via the AC input mechanism, and the AC input is passed to the corresponding AC input contacts on the driver module's housing. The driver module electronics are coupled to the AC input contacts and powered by the AC input. The AC input mechanism may be an Edison-style base, a GU-style base, wiring terminals, wires that extend from the housing, or the like.

Similarly, the drive adapter may have a drive output mechanism on one side and a snap-fit connector on another side. The snap-fit connector is configured to releasably attach to a counter (or complementary) snap-fit connector on the housing of the driver module. Both the driver module's housing and the drive adapter will have complementary drive contacts, which will contact each other when the drive adapter is in place. The drive input contacts of the drive adapter are electrically coupled to the drive output mechanism. As such, a light fixture or the like may be readily electrically coupled to the drive adapter via the drive output mechanism. The drive signal provided by the driver module electronics may be passed to the corresponding drive input contacts of the AC adapter via the AC output contacts of the driver module's housing. A detailed description of select embodiments of these concepts follows.

Figure 1:
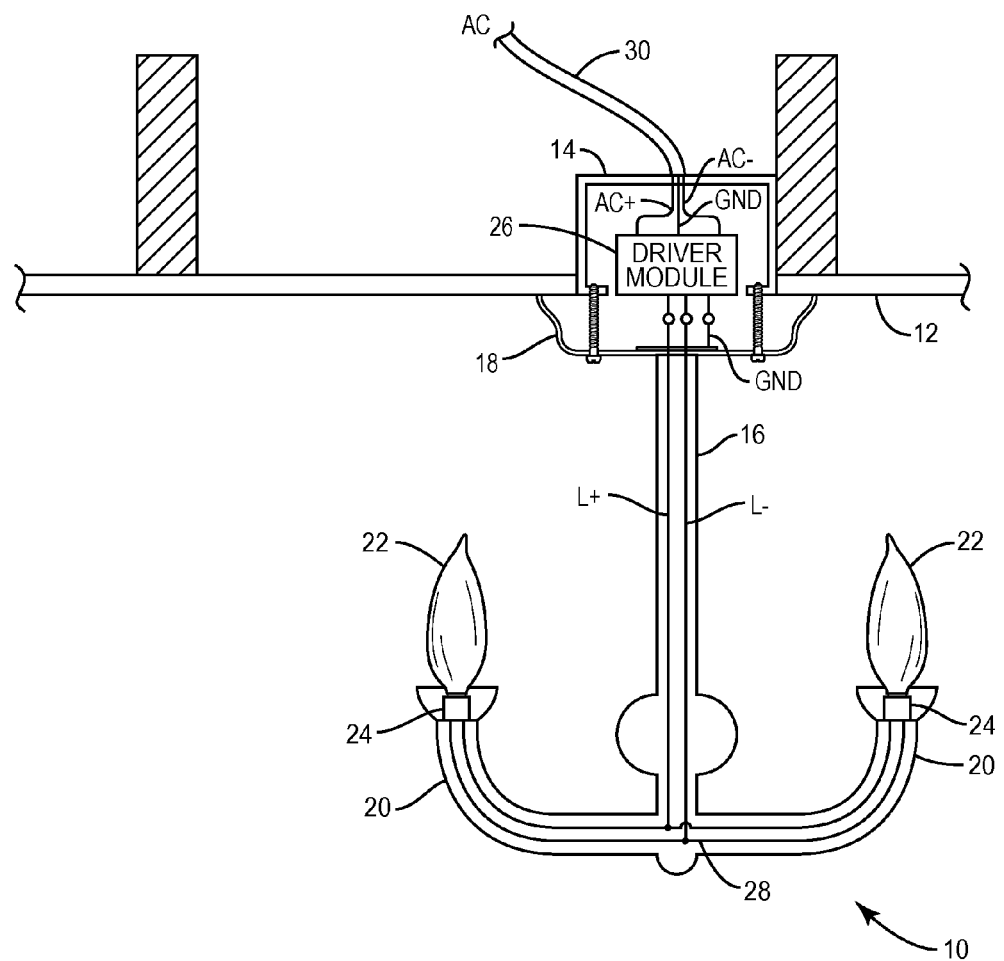
FIG. 1 is a light fixture according to a first embodiment of the present disclosure.

With reference to FIG. 1, a conventional light fixture 10 is shown mounted in a ceiling structure 12 to a conventional junction box 14. The illustrated light fixture 10 is illustrated as a chandelier with a body 16 that extends downward from the ceiling structure 12. The body 16 is coupled to the junction box 14 using traditional mounting hardware, which is not shown in an effort to more clearly the illustrate the concepts of the present disclosure. Adjacent the ceiling structure 12, an escutcheon plate 18 surrounds the body 16 and provides an ornamental shroud that covers the junction box 14. At the end of the body 16 opposite the ceiling structure 12, the light fixture 10 has multiple arms 20, which initially extend radially outward before curving upward. LED luminaires 22 are mounted in sockets 24, which are mounted at the ends of the arms 20 and designed to accept conventional Edison, GU-type, or like light bulb bases.

The LED luminaires are 22 are designed to operate on drive signals such as low voltage DC (direct current) or pulse width modulated (PWM) currents associated with voltages that are significantly less than the those associated with conventional 120 to 240 volt AC (alternating current) sources. The drive signals could also be high voltage DC or stepped AC. Only for the examples described herein, assume that low voltage drive signals are required. A driver module 26 is used to couple the existing internal wiring 28 of the light fixture 10 to the existing AC wiring 30 of the residential, commercial, or industrial structure. In essence, the driver module 26 accepts the AC signals from the AC wiring 30 of the structure, generates the type of drive signals needed to power the LED luminaires 22, and outputs the drive signals to the LED luminaires 22 over the internal wiring 28 of the light fixture 10. In this example, the drive signals are labeled as L+ and L−, wherein L− may be ground and L+ may represent a DC or PWM-based signal.

As such, the conventional light fixture 10 that was designed to connect to the AC wiring 30 and use conventional incandescent bulbs (not shown) may be converted to an efficient, LED-based fixture by 1) installing the driver module 26 between the AC wiring 30 and the internal wiring 28 of the light fixture 10, and 2) replacing the conventional incandescent bulbs with LED luminaires 22, which are compatible with the sockets 24 of the light fixture 10. Alternatively, the light fixture 10 may be designed to receive LED luminaires 22 with traditional or proprietary bases.

The driver module 26 may designed to fit into and perhaps mount inside of the junction box 14, as shown in FIG. 1, within a volume created by the escutcheon plate 18, a cavity within the light fixture 10, or any combination thereof. The driver module 26 may take on any desired shape, and as such may be square, rectangular, or a circular disk-shaped structure. Further, the driver module 26 may be annular, and as such, may be disk-shaped with an aperture extending through its body, wherein the body would lie in a plane that is parallel with the back of the junction box 14, and the aperture would be perpendicular the plane in which the body lies. As such, a donut-shaped structure would be able to pass mounting hardware, which is used to attach the light fixture 10 to the junction box 14, as well as wiring through the aperture.

Figure 2:
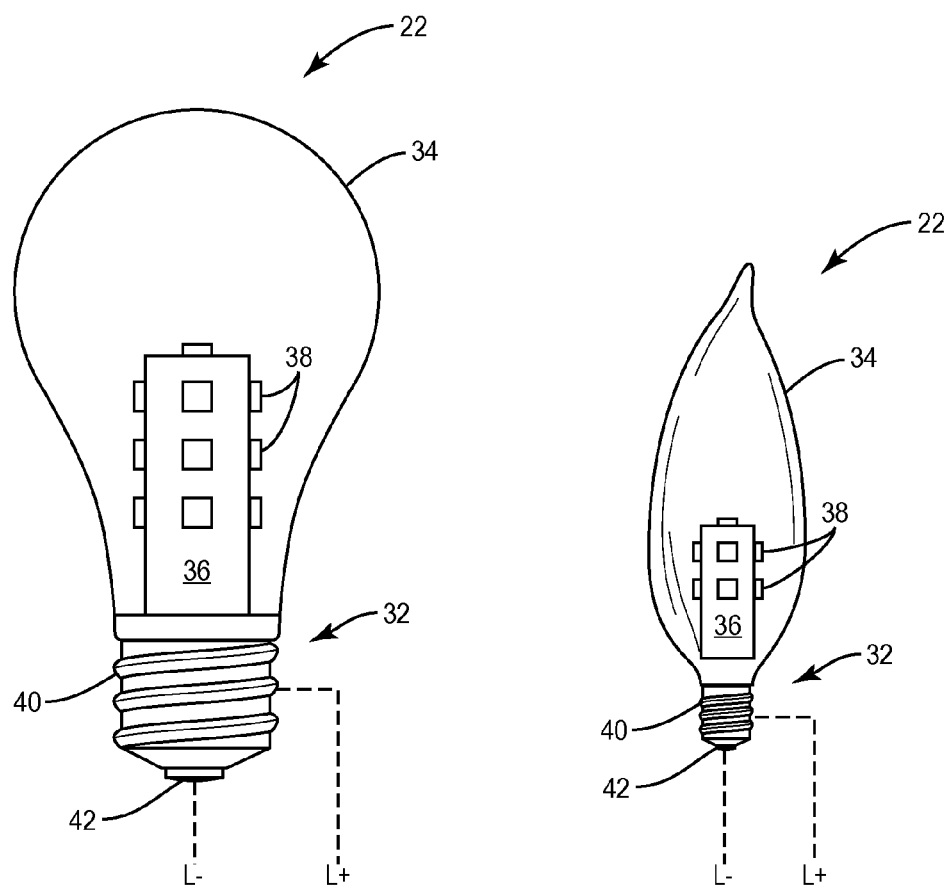
FIGS. 2A and 2B are LED-based luminaires according to one embodiment of the present disclosure.

From an aesthetic perspective, the LED luminaires 22 may take on virtually any shape; however, users tend to prefer the look and form factors of conventional light bulbs. In such cases, the LED luminaires 22 may be designed to appear substantially similar to conventional light bulbs, as illustrated in FIGS. 2A and 2B. FIG. 2A illustrates an LED luminaire 22 that replicates the form factor of a standard light bulb. In particular, the LED luminaire 22 has a medium (E26), Edison style base 32 coupled to a standard shaped globe 34. Instead of a filament, the light source residing within the globe 34 is an LED mounting structure 36 over which multiple LEDs 38 are distributed. Unlike conventional LED-based luminaires that each have built-in control electronics to provide the functionality of the driver module 26, the LED luminaires 22 include little or no driver electronics.

In the illustrated embodiment and from an electronics perspective, the LED luminaires 22 primarily include only the array of LEDs 38, which are coupled together in series, in parallel, or a combination thereof between two terminals. One terminal may be coupled to the thread contact 40 of the base 32 while the other terminal may be coupled to the foot contact 42 of the base 32. While supporting basic passive components and the like may be provided on the LED luminaire 22, there are little or no control electronics. When screwed or inserted into a compatible socket 24, each of the terminals is effectively coupled to one of the two wires provided by the internal wiring 28 of the light fixture 10. As such, the drive signals (L+, L−) provided by the driver module 26 are passed to the LED luminaires 22 via the internal wiring 28 and the corresponding sockets 24 of the light fixture 10.

FIG. 2B illustrates an LED luminaire 22 having a decorative candelabra-type globe 34 with a bent tip design and a smaller (E12), Edison style base 32. This luminaire configuration is suitable for chandeliers, wall sconces, and the like. Again, the light source residing within the globe 34 is an LED mounting structure 36 over which multiple LEDs 38 are distributed and driven via two terminals. As noted above, one terminal may be coupled to the thread contact 40 of the base 32 while the other terminal may be coupled to the foot contact 42 of the base 32.

Figure 3:
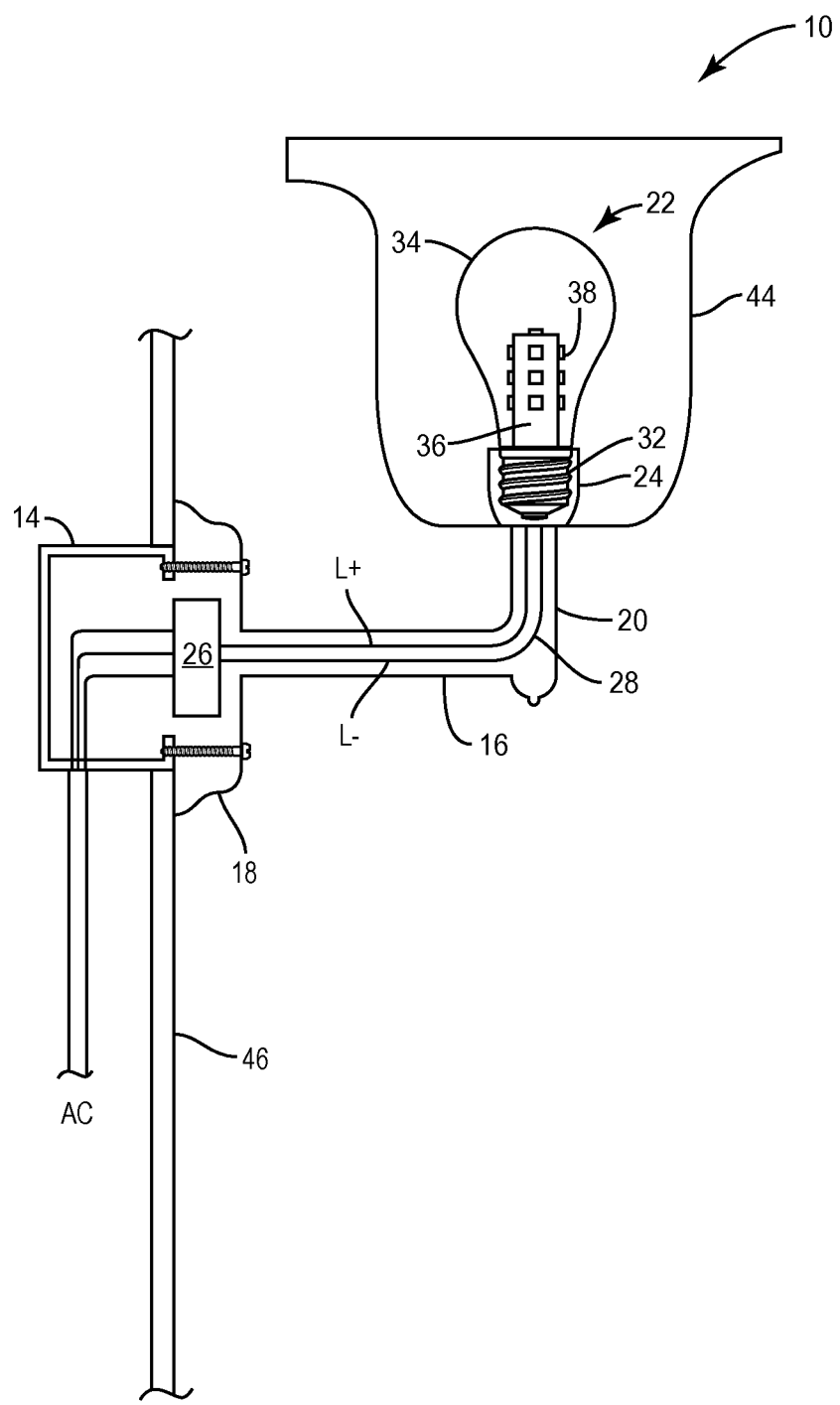
FIG. 3 is a light fixture according to a second embodiment of the present disclosure.

FIG. 3 illustrates another embodiment for the light fixture 10. In this embodiment, the light fixture 10 is a wall sconce, which is mounted to a junction box 14 and has a decorative globe 44. The junction box is recessed into a wall 46 in traditional fashion. The driver module 26 is shown residing within a volume created by the escutcheon plate 18, but could also reside within the junction box 14, as provided in FIG. 1. The driver module 26 functions as described above.

A description of an exemplary embodiment of the LED luminaire 22 and driver module 26 follows. As noted, the LED luminaire 22 includes one or more LEDs 38. In the illustrated embodiments, multiple LEDs 38 are distributed over an LED mounting structure 36 wherein the LEDs 38 are loosely referred to as being in an array. The terms "LED array" or "array of LEDs" are merely used to identify the group of LEDs 38 and indicate that they are distributed in virtually any fashion over the LED mounting structure 36 or the like.

Figure 4:
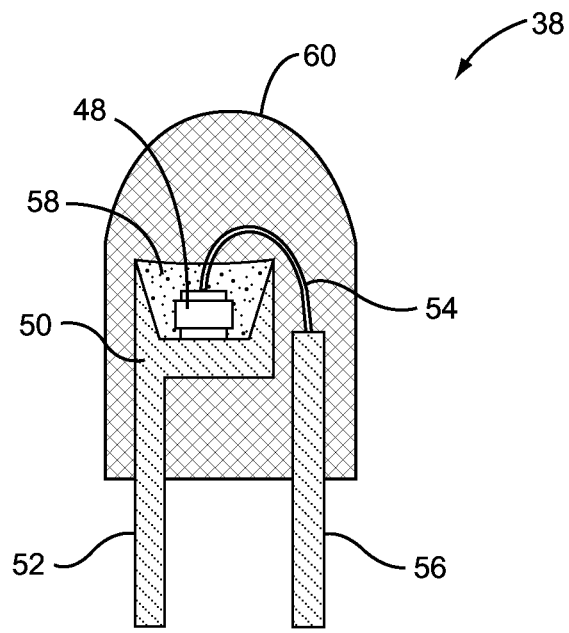
FIG. 4 is an LED according to one embodiment of the present disclosure.
Figure 5:
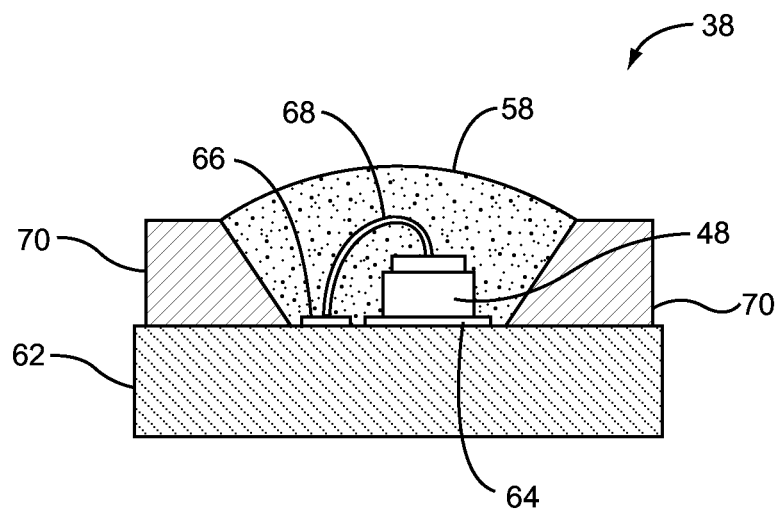
FIG. 5 is an LED according to another embodiment of the present disclosure.

Exemplary configurations for the LEDs 38 are illustrated in FIGS. 4 and 5. With reference to FIG. 4, a single LED chip 48 is mounted on a reflective cup 50 using solder or a conductive epoxy, such that ohmic contacts for the cathode (or anode) of the LED chip 48 are electrically coupled to the bottom of the reflective cup 50. The reflective cup 50 is either coupled to or integrally formed with a first lead 52 of the LED 38. One or more bond wires 54 connect ohmic contacts for the anode (or cathode) of the LED chip 48 to a second lead 56.

The reflective cup 50 may be filled with an encapsulant material 58 that encapsulates the LED chip 48. The encapsulant material 58 may be clear or may contain a wavelength conversion material, such as a phosphor, which is described in greater detail below. The entire assembly is encapsulated in a clear protective resin 60, which may be molded in the shape of a lens to control the light emitted from the LED chip 48.

An alternative package for an LED 38 is illustrated in FIG. 5 wherein the LED chip 48 is mounted on a substrate 62. In particular, the ohmic contacts for the anode (or cathode) of the LED chip 48 are directly mounted to first contact pads 64 on the surface of the substrate 62. The ohmic contacts for the cathode (or anode) of the LED chip 48 are connected to second contact pads 66, which are also on the surface of the substrate 62, using bond wires 68. The LED chip 48 resides in a cavity of a reflector structure 70, which is formed from a reflective material and functions to reflect light emitted from the LED chip 48 through the opening formed by the reflector structure 70. The cavity formed by the reflector structure 70 may be filled with an encapsulant material 58 that encapsulates the LED chip 48. The encapsulant material 58 may be clear or may contain a wavelength conversion material, such as a phosphor.

In either of the embodiments of FIGS. 4 and 5, if the encapsulant material 58 is clear, the light emitted by the LED chip 48 passes through the encapsulant material 58 and the protective resin 60 (FIG. 4) without any substantial shift in color. As such, the light emitted from the LED chip 48 is effectively the light emitted from the LED 38. If the encapsulant material 58 contains a wavelength conversion material, substantially all or a portion of the light emitted by the LED chip 48 in a first wavelength range may be absorbed by the wavelength conversion material, which will responsively emit light in a second wavelength range.

The concentration and type of wavelength conversion material will dictate how much of the light emitted by the LED chip 48 is absorbed by the wavelength conversion material as well as the extent of the wavelength conversion. In embodiments where some of the light emitted by the LED chip 48 passes through the wavelength conversion material without being absorbed, the light passing through the wavelength conversion material will mix with the light emitted by the wavelength conversion material. Thus, when a wavelength conversion material is used, the light emitted from the LED 38 is shifted in color from the actual light emitted from the LED chip 48.

For example, an array of LEDs 38 may include a group of blue-shifted yellow (BSY) or blue-shifted green (BSG) LEDs 38 as well as a group of red LEDs 38. BSY LEDs 38 include an LED chip 48 that emits bluish light, and the wavelength conversion material is a yellow phosphor that absorbs the blue light and emits yellowish light. Even if some of the bluish light passes through the phosphor, the resultant mix of light emitted from the overall BSY LED 38 is yellowish light. The yellowish light emitted from a BSY LED 38 has a color point that falls above the Black Body Locus (BBL) on the 1931 CIE chromaticity diagram wherein the BBL corresponds to the various color temperatures of white light.

Similarly, BSG LEDs 38 include an LED chip 48 that emits bluish light; however, the wavelength conversion material is a greenish phosphor that absorbs the blue light and emits greenish light. Even if some of the bluish light passes through the phosphor, the resultant mix of light emitted from the overall BSG LED 38 is greenish light. The greenish light emitted from a BSG LED 38 has a color point that falls above the BBL on the 1931 CIE chromaticity diagram wherein the BBL corresponds to the various color temperatures of white light.

The red LEDs 38 generally emit reddish light at a color point on the opposite side of the BBL as the yellowish or greenish light of the BSY or BSG LEDs 38. As such, the reddish light from the red LEDs 38 mixes with the yellowish or greenish light emitted from the BSY or BSG LEDs 38 to generate white light that has a desired color temperature and falls within a desired proximity of the BBL. In effect, the reddish light from the red LEDs 38 pulls the yellowish or greenish light from the BSY or BSG LEDs 38 to a desired color point on or near the BBL. Notably, the red LEDs 38 may have LED chips 48 that natively emit reddish light wherein no wavelength conversion material is employed. Alternatively, the LED chips 48 may be associated with a wavelength conversion material, wherein the resultant light emitted from the wavelength conversion material and any light that is emitted from the LED chips 48 without being absorbed by the wavelength conversion material mixes to form the desired reddish light.

The blue LED chip 48 used to form either the BSY or BSG LEDs 38 may be formed from a gallium nitride (GaN), indium gallium nitride (InGaN), silicon carbide (SiC), zinc selenide (ZnSe), or like material system. The red LED chip 48 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein. Further, LEDs 38 of various colors, including white, may be used alone or in any combination in the LED luminaire 22.

Figure 6:
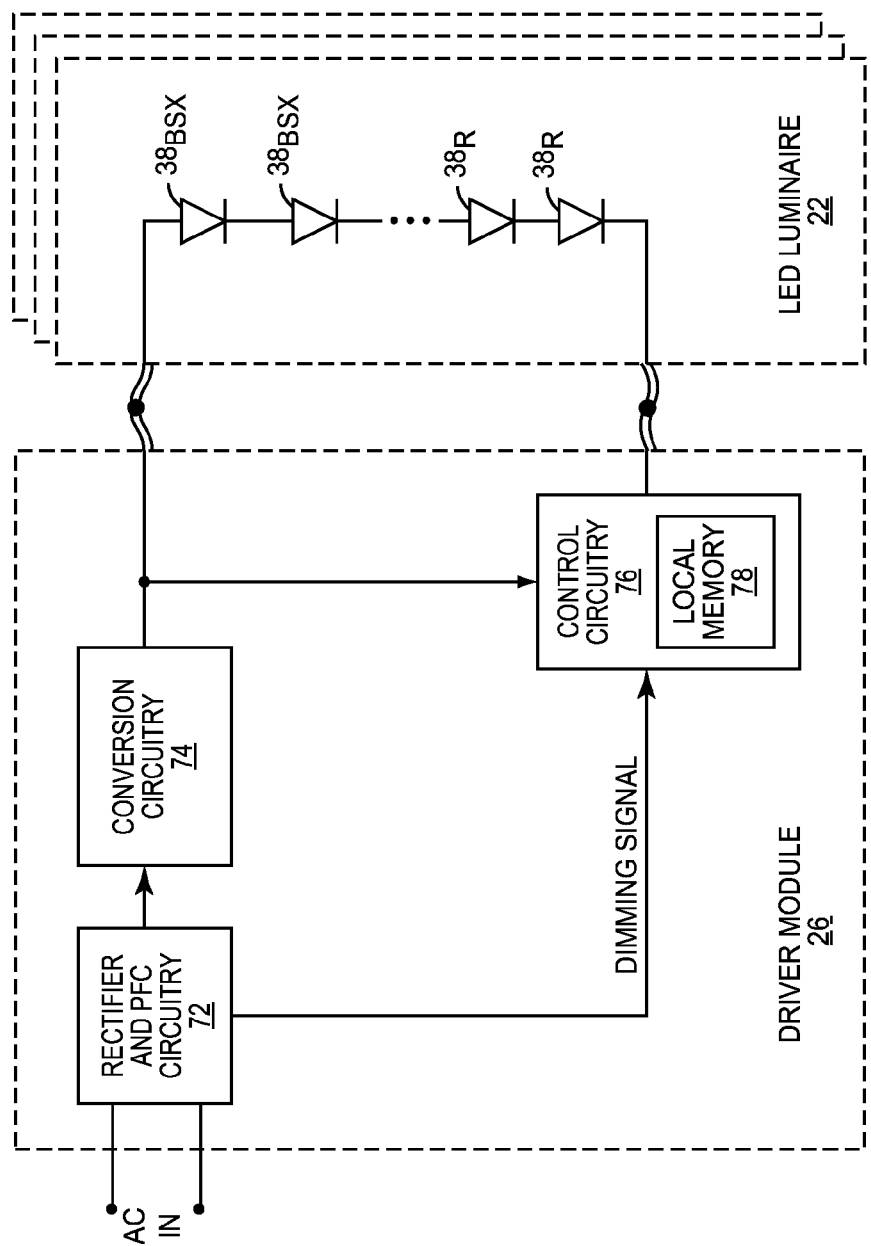
FIG. 6 is a schematic representation of driver module electronics and an LED luminaire according to one embodiment of the present disclosure.

As noted, the array of LEDs 38 of the LED luminaire 22 may include a mixture of LEDs 38 of different colors, such as a combination of red LEDs 38 and either BSY or BSG LEDs 38. The electronics for the driver module 26 for driving the LED luminaire 22, and thus the array of LEDs 38, is illustrated in FIG. 6 according to one embodiment of the present disclosure. As depicted, there is a mixture of red LEDs 38 and either BSY or BSG LEDs 38 in a single string; however, other embodiments may employ multiple strings and different color combinations. For clarity, the reference number "38" will include a subscript indicative of the color of the LED 38 in the following text where 'IR' corresponds to red, 'BSY' corresponds to blue-shifted yellow, 'BSG' corresponds to blue-shifted green, and 'BSX' corresponds to either BSG or BSY LEDs.

In essence, the driver module 26 controls the current delivered to the string of LEDs 38. The current used to drive the LEDs 38 is generally either DC or pulse width modulated (PWM). When the current is DC, the level of the current controls the intensity of the light emitted from the LEDs 38. When the current is PWM, the duty cycle of the PWM signal controls the intensity of the light emitted from the LEDs 38. The color or color temperature of the light emitted from the LED luminaire 22 is generally a function of the combined light from the various LEDs 38 as well as any coloration or filtering provided by the globe 34 of the LED luminaire 22. In this example, the resultant yellowish or greenish light from the either the BSY or BSG LEDs $38_{BSX}$ mixes with the reddish light from the red LEDs $38_R$ to generate white light that has a desired color temperature and falls within a desired proximity of the BBL.

The driver module 26 generally includes rectifier and power factor correction (PFC) circuitry 72, conversion circuitry 74, and control circuitry 76, which will include a central processing unit (not shown) and local memory 78. The adjective "local" is used primary to identify the local memory 78 as being resident virtually anywhere on the driver module 26.

The rectifier and power factor correction circuitry 72 is adapted to receive an AC power signal (AC IN) via the AC wiring 30, rectify the AC power signal, and correct the power factor of the AC power signal. The resultant signal is provided to the conversion circuitry 74, which converts the rectified AC power signal to a DC power signal. The DC power signal may be boosted (increased) or bucked (reduced) to one or more desired DC voltages by DC-DC converter circuitry, which is provided by the conversion circuitry 74. Internally, The DC power signal may be used to power the control circuitry 76 and any other circuitry provided in the driver module 26.

As illustrated, the DC power signal may also be provided to another port, which will be directly or indirectly coupled to the LEDs 38 of the LED luminaire 22 via the internal wiring 28 of the light fixture 10 or the like. In this embodiment, the supply line of the DC power signal is effectively coupled to a first end of the string of LEDs 38. The control circuitry 76 may be coupled in like fashion to the second end of the string of LEDs 38. Based on any number of fixed or dynamic parameters, the control circuitry 76 may individually control the pulse width modulated (or DC) current that flows through the LEDs 38 such that the resultant white light emitted from the LED strings has a desired intensity. Notably, the architecture used to drive the array of LEDs 38 in this embodiment is merely exemplary, as those skilled in the art will recognize other architectures for controlling the drive voltages and currents presented to the LEDs 38.

In certain instances, a dimming device controls the AC power signal. The rectifier and PFC circuitry 72 may be configured to detect the relative amount of dimming associated with the AC power signal and provide a corresponding dimming signal to the control circuitry 76. Based on the dimming signal, the control circuitry 76 will adjust the current provided to the string of LEDs 38 to effectively reduce the intensity of the resultant white light emitted from the LED luminaire 22.

Figure 7A:
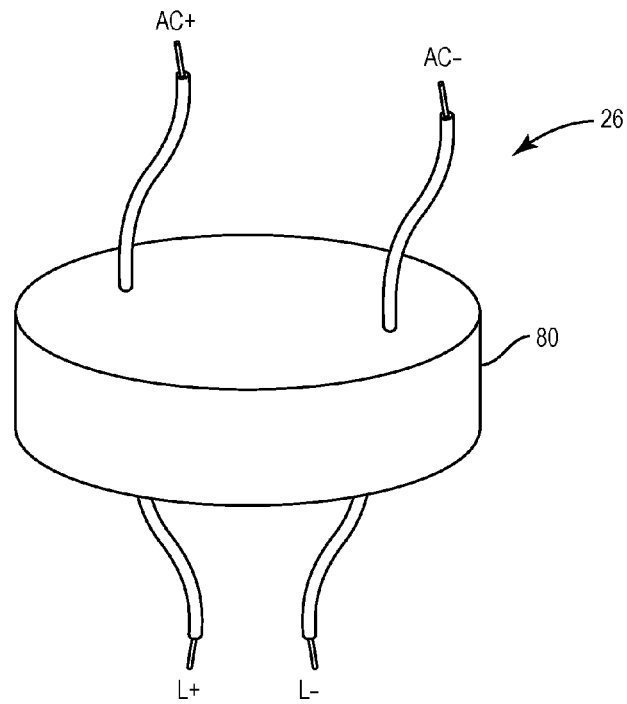
FIG. 7A is a perspective view of a driver module according to a first embodiment.
Figure 7B:
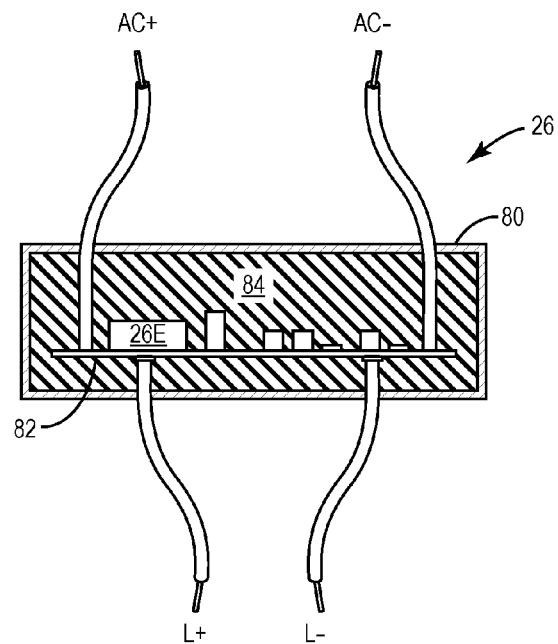
FIG. 7B is a cross-section of the driver module of FIG. 7A.

With reference to FIGS. 7A and 7B, an exemplary housing structure is illustrated for one embodiment of the driver module 26. In FIG. 7A, the driver module 26 has a circular disk-shaped housing 80 through which wires are provided for the AC input (AC+, AC−) on a top surface and the drive signals (L+, L−) on a bottom surface. FIG. 7B illustrates an exemplary cross-section of the driver module 26. As illustrated, the housing 80 has an internal cavity in which a printed circuit board (PCB) 82 is mounted. The PCB 82 will have the requisite driver module electronics 26E, such as those illustrated in FIG. 6, mounted thereto. The wires for the AC input (AC+, AC−) and the drive signals (L+, L−) may be soldered to the PCB 82 or coupled via appropriate wiring terminals. A thermally conductive potting material 84 may be used to fill the cavity, and thus, completely or at least substantially surround the PCB 82 such that the electronics are in thermal contact with the thermally conductive potting material 84. If the cavity is completely or substantially filled with the thermally conductive potting material 84, heat generated by the electronics on the PCB 82 is dissipated throughout the thermally conductive potting material 84 and transferred to the housing 80. Notably, the thermally conductive potting material 84 is a dielectric, and is thus not electrically conductive.

The housing 80 may be formed from a thermoplastic, metal, thermal epoxy compound, or the like. If all or portions of the housing 80 are made from a thermally conductive material, heat transferred from the electronics to the interior surfaces of the housing 80 via the thermally conductive potting material 84 is readily transferred through the walls of the housing 80 to the exterior surfaces of the housing 80 for very effective heat dissipation. The thermally conductive potting material 84 may be formed from potting compounds, such as Dow Corning Sylgard™, thermally conductive plastics, such as Cool Polymers Coolpoly™, encapsulants, such as Henkel Macromelt®, or the like.

Figure 8A:
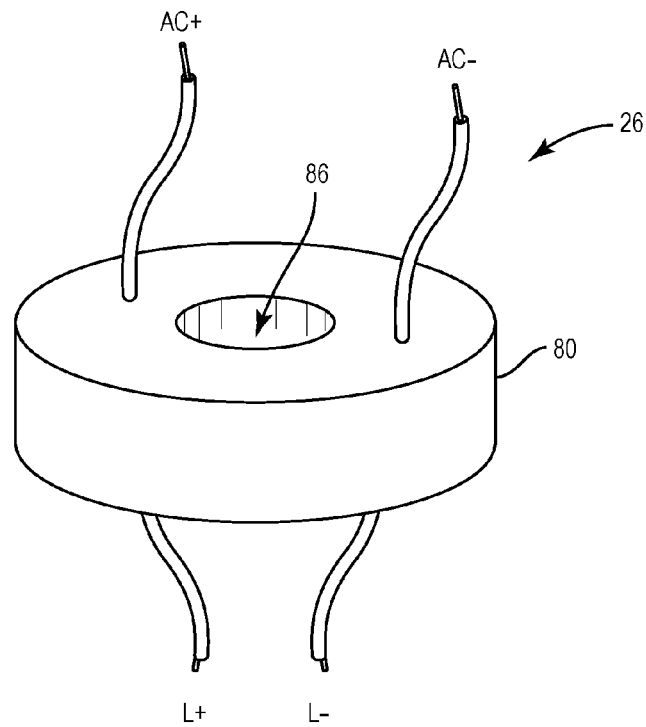
FIG. 8A is a perspective view of a driver module according to a second embodiment.
Figure 8B:
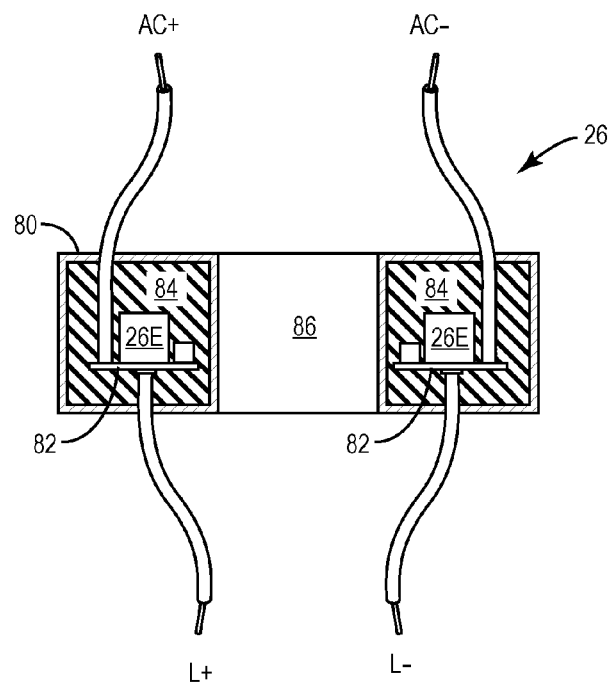
FIG. 8B is a cross-section of the driver module of FIG. 8A.

To provide mounting flexibility, the housing 80 of the driver module 26 may have a through hole 86 that extends from the top surface to the bottom surface of the housing 80, as shown in FIGS. 8A and 8B. The through hole 86 provides a passage for mounting hardware of the light fixture 10 that extends into the junction box 14. As such, the PCB 82 may be annular or broken into sections. The annular interior cavity (or cavities) of the housing 80 may be filled with the thermally conductive potting material 84.

With reference to FIG. 9A, an AC input side 90 of the illustrated driver module 26 may be configured to readily receive an AC adapter 88. In particular, the AC input side 90 of the driver module 26 will include a snap-fit connector 92 and at least two AC input contacts 94. The AC adapter 88 has an AC output side 96, which includes a counter snap-fit connector 98 and at least two AC output contacts 100. The snap-fit connector 92 of the driver module 26 is configured to mate with the counter snap-fit connector 98 of the AC adapter 88 in such a manner as to securely attach the AC adapter 88 to the AC input side 90 of the driver module 26. The nature of the attachment should be one in which the AC adapter 88 can be readily released from the driver module 26 without undue effort. As such, the AC adapter 88 is said to be releasably attachable to the driver module 26 via the respective snap-fit connector 92 and the counter snap-fit connector 98.

The snap-fit connector 92 and the counter snap-fit connector 98 may be configured for a direct snap attachment without the need for twisting or turning, as well as a twist and lock attachment. In the latter case, one of the AC adapter 88 and the driver module 26 is inserted into an initial position and then rotated relative to the other to snap into position. In either case, there is no need for tools to attach the AC adapter 88 to or remove the AC adapter 88 from the driver module 26. Notably, the snap-fit connector 92 and the counter snap-fit connector 98 need not take the form illustrated in FIG. 9A. The illustrated embodiment for the snap-fit connector 92 and the counter snap-fit connector 98 is merely one that easily and clearly illustrates the snap-fit concept. Those skilled in the art will recognize alternatives, which are considered within the scope of the present disclosure.

When the AC adapter 88 is attached to the driver module 26, each AC output contact 100 of the AC adapter 88 will make mechanical, and thus electrical contact, with a corresponding one of the AC input contacts 94 on the AC input side 90 of the driver module 26. In the illustrated embodiment, the AC adapter 88 has an AC input mechanism for connecting to the AC input (AC+, AC−). In FIG. 9A, the AC input mechanism is shown as an Edison style base 102 with a thread contact 104 and a foot contact 106. The Edison style base 102 is configured to thread into a compatible socket, which is coupled to an AC input.

The thread contact 104 of the Edison style base 102 is connected to one of the AC output contacts 100, and the foot contact 106 is connected to another of the AC output contacts 100 via internal wiring, which is illustrated with dashed lines. When an AC input (AC+, AC−) is presented to the socket, the AC input (AC+, AC−) is conducted from the thread contact 104 and the foot contact 106 to the respective AC output contacts 100. The AC input (AC+, AC−) is passed from the AC output contacts 100 of the AC adapter 88 to the respective AC input contacts 94 of the driver module 26. The AC input contacts 94 of the driver module 26 are connected to the driver module electronics 26E, and as such, the AC input (AC+, AC−) is provided to the driver module electronics 26E. Upon receiving the AC input, the driver module electronics 26E will provide the drive signals (L+, L−) via a drive output, which is illustrated as two drive wires 108.

While FIG. 9A illustrates the AC input contacts 94 outside of the snap-fit connector 92 and AC output contacts 100 outside of the counter snap-fit connector 98, the locations of the AC input and output contacts 94, 100 may be located virtually anywhere in symmetrical or asymmetrical fashion. For example, the embodiment of FIG. 9B provides both of the AC input and output contacts 94, 100 inside of the snap-fit connector 92 and the counter snap-fit connector 98, respectively. The embodiment of FIG. 9C provides one of the AC input and output contacts 94, 100 inside of the snap-fit connector 92 and the counter snap-fit connector 98 and another of the AC input and output contacts 94, 100 outside of the snap-fit connector 92 and the counter snap-fit connector 98. Other configurations will be recognized by those skilled in the art upon reading this disclosure.

Figure 10A:
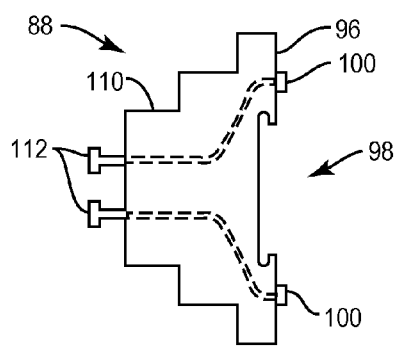

While the AC adapter 88 is shown with an Edison style base 102 as the AC input mechanism in FIGS. 9A, 9B, and 9C, many other AC input mechanisms may be used. A few of the different AC input mechanisms are illustrated in FIGS. 10A through 10D. In FIG. 10A, the AC input mechanism is a GU-style base 110 with at a pair of GU style terminals 112. Each of the GU style terminals 112 is electrically coupled to a corresponding one of the AC output contacts 100. In FIG. 10B, the AC input mechanism is a number of screw terminals 114. Three screw terminals 114 are shown to illustrate that any number of terminals are possible. Two of the screw terminals 114 are electrically coupled to a corresponding one of the AC output contacts 100. In the illustrated embodiment, a third screw terminal may be connected to ground, which may or may not need to be passed to the driver module 26 or the driver module electronics 26E through a third AC output contact 100 (not shown).

Figure 10C:
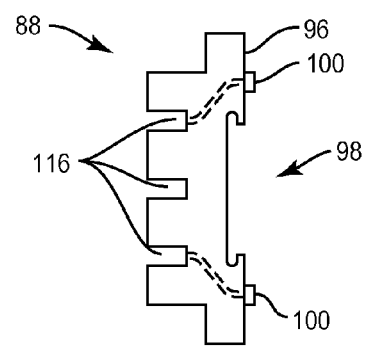
Figure 10B:
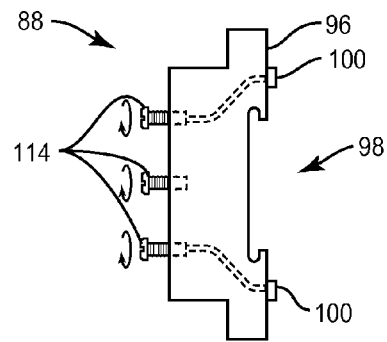
Figure 10D:
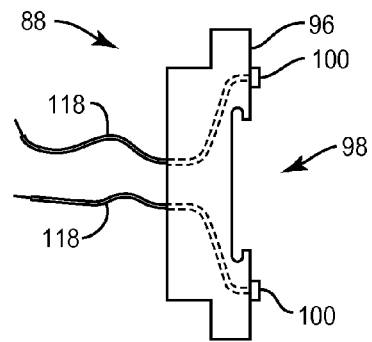

In FIG. 10C, the AC input mechanism is a number of spring terminals 116, each of which is configured as a recessed opening that has a spring-loaded member that mechanically catches wires that are inserted into the opening. Each of the spring-loaded members is conductive and electrically coupled to a corresponding one of the AC output contacts 100. In the illustrated embodiment, a third spring-loaded member may be connected to ground, which may or may not need to be passed to the driver module 26 or the driver module electronics 26E through a third AC output contact 100 (not shown). In FIG. 10D, the AC input mechanism is a pair of wires 118. Each of the wires 118 is electrically coupled to a corresponding one of the AC output contacts 100.

With reference to FIG. 11A, a drive output side 120 of the illustrated driver module 26 may be configured to readily receive a drive adapter 122. In particular, the drive output side 120 of the driver module 26 will include a snap-fit connector 124 and at least two drive output contacts 126. The drive adapter 122 has a drive input side 128, which includes a counter snap-fit connector 130 and at least two drive input contacts 132. The snap-fit connector 124 of the driver module 26 is configured to mate with the counter snap-fit connector 130 of the drive adapter 122 in such a manner as to securely attach the drive adapter 122 to the drive output side 120 of the driver module 26. The nature of the attachment should be one in which the drive adapter 122 can be readily released from the driver module 26 without undue effort. As such, the drive adapter 122 is said to be releasably attachable to the driver module 26 via the respective snap-fit connector 124 and the counter snap-fit connector 130.

The snap-fit connector 124 and the counter snap-fit connector 130 may be configured for a direct snap attachment without the need for twisting or turning as well as for a twist and lock attachment. In the latter case, one of the drive adapter 122 and the driver module 26 is inserted into an initial position and then rotated relative to the other to snap into position. In either case, there is no need for tools to attach the drive adapter 122 to or remove the drive adapter 122 from the driver module 26. Notably, the snap-fit connector 124 and the counter snap-fit connector 130 need not take the form illustrated in FIG. 11A. The illustrated embodiment for the snap-fit connector 124 and the counter snap-fit connector 130 is merely one that easily and clearly illustrates the snap-fit concept. Those skilled in the art will recognize alternatives, which are considered within the scope of the present disclosure.

When the drive adapter 122 is attached to the driver module 26, each drive input contact 132 of the drive adapter 122 will make mechanical, and thus electrical, contact with a corresponding one of the drive output contacts 126 on the drive output side 120 of the driver module 26. In the illustrated embodiment, the drive adapter 122 has a drive output mechanism for connecting to the light fixture 10. As illustrated in FIG. 11A, the drive output mechanism can simply be wires 134. While not illustrated, a ground path may be provided from the AC input to the light fixture 10 via the driver module 26 and either or both of the AC adapter 88 and drive adapter 122.

In FIG. 11A, one of the wires 134 is connected to one of the drive input contacts 132, and the other of the wires 134 is connected to another of the drive output contacts 132 via internal wiring, which is illustrated with dashed lines. In operation, when the drive signals L+, L− are generated by the driver module electronics 26E, the drive signals are provided to the drive output contacts 126 of the driver module 26. The drive signals are passed to the drive input contacts 132 of the drive adapter 122, which further passes the drive signals to the wires 134 and on to the light fixture 10.

While FIG. 11A illustrates the drive output contacts 126 outside of the snap-fit connector 124 and drive input contacts 132 outside of the counter snap-fit connector 130, the locations of the drive output and input contacts 126, 132 may be located virtually anywhere in a symmetrical or asymmetrical fashion. For example, the embodiment of FIG. 11B provides both of the drive output and input contacts 126, 132 inside of the snap-fit connector 124 and the counter snap-fit connector 130, respectively. The embodiment of FIG. 11C provides one of the drive output and input contacts 126, 132 inside of the snap-fit connector 124 and the counter snap-fit connector 130 and another of the drive output and input contacts 126, 132 outside of the snap-fit connector 124 and the counter snap-fit connector 130. Other configurations will be recognized by those skilled in the art upon reading this disclosure. In addition to the wires 134, the drive output mechanism could be various types of terminals, such as spring or screw terminals, such as those shown if FIGS. 10B and 10C.

With reference to FIG. 12, the drive adapter 122 may be equipped with a mounting bracket 136, which may be used to attach the drive adapter 122, and thus the driver module 26, to a mounting structure, such as a ceiling or wall. The mounting bracket 136 may also be configured to attach to part of the light fixture 10, a chain or structural extension connected to the light fixture 10, the escutcheon plate 18 of the light fixture 10, mounting hardware for the light fixture 10, or the like.

FIG. 13 illustrates an embodiment where an LED luminaire 22 is attached directly to a front face of the drive adapter 122. In essence, the array of LEDs 38 is mounted on the front face and may be associated with a reflector and lens or globe assembly for controlling light output. The drive input contacts 132 are coupled to nodes on the respective ends of the array of LEDs 38.

FIG. 14 illustrates an embodiment wherein the driver modules 26 are stacked in series to increase the amount of power available to drive a light fixture 10. Such an embodiment may be particularly useful when the light fixture 10, such as a track light system or chandelier, has a large number of LED luminaires 22. The illustrated embodiment also shows the optional use of an AC adapter 88 and a drive adapter 122. The AC adapter 88 may provide a snap-fit connection with the AC input side 90A of the driver module 26A via the snap-fit and counter snap-fit connectors 92A, 98, and the drive adapter 122 may provide a snap-fit connection with the drive output side 120 of the driver module 26B via the snap-fit and counter snap-fit connectors 124B, 130, as described above. Similarly, the driver modules 26A and 26B may provide a snap-fit connection with each other via the snap-fit connector 144 of driver module 26A and the counter snap-fit connector 146 of drive module 26B.

Initially, the AC input (AC+, AC−) is passed to the AC output contacts 100 of the AC adapter 88. The AC output contacts 100 are mechanically and electrically coupled to the AC input contacts 94A, which are on the AC input side 90A of the driver module 26A. The driver module 26A is configured to pass the AC input (AC+, AC−) to its driver module electronics 26E as well as to the AC output contacts 148A on the drive output side 120A.

The AC output contacts 148A of the driver module 26A are mechanically and electrically coupled to the AC input contacts 94B, which are on the AC input side 90B of the driver module 26B. The driver module 26B is configured to pass the AC input (AC+, AC−) to its driver module electronics 26E, and if configured the same as the driver module 26A, may also pass the AC input (AC+, AC−) to the AC output contacts 148B on the drive output side 120B. As illustrated, the drive adapter 122 does not have opposing contacts for the AC output contacts 148B and will merely act as an insulator to cover the AC output contacts 148B, since access to the AC input (AC+, AC−) is not required by the drive adapter 122. If such contacts were presented, they would not be connected to anything by the drive adapter 122. As such, the driver modules 26A and 26B may provide an AC pass-through bus, such that AC may be passed through one driver module 26 to help power another driver module 26.

To increase the amount of power (or current) that is available to drive the LED luminaires 22 of the light fixture 10, the drive signals (L+, L−) that are provided by the driver module electronics 26E of both driver module 26A and driver module 26B may be combined. In one embodiment, the drive signals that are generated by the driver module electronics 26E of driver module 26A are effectively provided to the drive output contacts 126A, which are coupled to drive input contacts 150B of the driver module 26B. The drive signals that are received at the drive input contacts 150B of the driver module 26B are summed with the drive signals provided by the driver module electronics 26E of the driver module 26B by summing circuitry 152B. The summation of the drive signals is provided to the drive output contacts 126B of the driver module 26B and passed to the drive input contacts 132B of the drive adapter 122 and on to the wires 134.

If the driver modules 26A and 26B are configured in a similar manner for modularity and manufacturing uniformity, the driver module 26A may also have summing circuitry 152A, which is configured to sum signals received from the drive input contacts 150A with the drive signals generated by its driver module electronics 26E. In this instance, no signals will be presented to the drive input contacts 150A for summing with the drive signals generated by the driver module electronics 26E of the driver module 26A. The AC adapter 88 may not have opposing contacts for the drive input contacts 150A. If such contacts were presented, they would not be connected to anything by the AC adapter 88. As such, each driver module 26 may provide a drive summation bus, such that drive signals from the series connected driver modules 26 may be summed and passed on to another driver module 26, a drive adapter 122, or a light fixture 10. Notably, any of the above contacts may be replaced with wires, terminals, or the like that extend from the driver module 26. Collectively, these wires, terminals, and the like are referred to as AC or drive input or output points depending on whether the signal is in essence being provided by (output) or received by (input) the entity of reference.

The concepts of the above disclosure also extend to incorporating the driver module 26 into components that reside outside of a junction box 14. In FIG. 15, the driver module 26' takes the form of a plug-in module. In particular, the housing 80' contains the driver module electronics 26E, which receive AC input via a standard NEMA (North American Electrical Manufacturers) or like plug 154 on the back of the housing 80' and presents the drive signals via a NEMA or like socket 156 on the front of the housing 80'. As such, the driver module 26' may be plugged into a standard AC socket 158 via the plug 154, and a light fixture 10' with a an LED luminaire 22 may be plugged into the socket 156 using the light fixture's standard plug 160.

With reference to FIGS. 16 through 18, a particular implementation for the driver module 26, AC adapter 88, and drive adapter 122 is illustrated. With particular reference to FIG. 16, the driver module 26 is configured with a recessed snap-fit connector 124 on its drive output side 120 and a recessed snap-fit connector 92 on its AC input side 90. The recessed snap-fit connector 124 on the drive output side 120 is configured to receive a protruding counter snap-fit connector 130 of the drive adapter 122. Similarly, the recessed snap-fit connector 92 on the AC input side 90 is configured to receive a protruding counter snap-fit connector 98 of the AC adapter 88. Except for size, the counter and snap-fit connectors 98 and 92 are essentially the same as the counter and snap-fit connectors 130 and 124. The difference in sizes is not necessary and is shown merely to illustrate a technique to help ensure that the drive adapter 122 and the AC adapter 88 are not connected to the wrong sides of the driver module 26.

What follows is a detailed description of the counter and snap-fit connectors 130 and 124 for the drive adapter 122 and the drive output side 120 of the driver module 26. The counter and snap-fit connectors 98 and 92 of the AC adapter 88 and the AC input side 90 of the driver module 26 are configured and engage each other in analogous fashion. With reference to FIGS. 16 and 17, the counter snap-fit connector 130 includes a central support 162, which extends perpendicularly from the top side of the drive adapter 122. An elongated plate 164 is provided on the end of the central support 162 and is generally parallel to the top side of the drive adapter 122. The elongated plate 164 may have one or more locking recesses (shown) or dimples (not shown) in the top (shown) or bottom side (not shown) of the elongated plate 164. Drive input contacts 132 may be provided on the elongated plate 164. As illustrated, the elongated plate 164 may have curved ends, which provide support for the drive input contacts 132. These drive input contacts 132 are respectively coupled to the wires 134, as described above. An alignment pin 168 may be provided in the center of the top side of the elongated plate 164. The alignment pin 168 extends perpendicularly from the top side of the elongated plate 164.

The counter snap-fit connector 130 of the drive adapter 122 is configured to slide into the snap-fit connector 124 of the driver module 26 and be rotated 90 degrees to snap into to place. As illustrated in FIGS. 16 and 18, the snap-fit connector 124 of the driver module 26 includes an elongated entry slot 170, which leads to a locking chamber 172. An alignment recess 174 is provided in the center of the locking chamber 172. The locking chamber 172 may take various overall shapes. For example, the locking chamber 172 may be essentially circular (not shown), shaped like opposing quadrants of a circle (shown), or anything therebetween.

The elongated entry slot 170 is sized to readily receive the elongated plate 164 of the counter snap-fit connector 130. The depth of the elongated entry slot 170 generally corresponds to the height of the central support 162 of the counter snap-fit connector 130. The size and shape of the locking chamber 172 is configured to receive the elongated plate 164, once the top side of the drive adapter 122 is moved into contact with the drive output side 120 of the driver module 26, and allows the elongated plate 164 to be rotated into a locking position by rotating the drive adapter 122. In the illustrated embodiment, the locking position is 90 degrees relative to the elongated entry slot 170.

The alignment recess 174, which is positioned in the back of the locking chamber 172, is sized to receive the alignment pin 168 of the counter snap-fit connector 130. Further, the locking chamber 172 may have locking bumps 176, which correspond to locking recesses 166 located in the counter snap-fit connector 130. The locking bumps 176 will be positioned in the locking chamber 172 so that the locking recesses 166 of the counter snap-fit connector 130 engage the bumps 176 once the elongated plate 164 is rotated into the locking position. This engagement functions to hold the elongated plate 164 in the locking position, and thus, hold the drive adapter 122 in a secure, snap-fit engagement with the driver module 26. To remove the drive adapter 122 from the driver module 26, the drive adapter 122 is rotated 90 degrees in the opposite direction until the elongated plate 164 aligns with the elongated entry slot 170 and is then pulled away from the driver module 26, wherein the elongated plate 164 will slide through the elongated entry slot 170.

Notably, the locking chamber 172 will include drive output contacts 126, which are coupled to the driver module electronics 26E and will provide the drive signals to the drive input contacts 132 of the counter snap-fit connector 130. Once the elongated plate 164 is in the locking position, the drive input contacts 132 of the counter snap-fit connector 130 are configured to make mechanical and electrical contact with the drive output contacts 126 of the locking chamber 172. In this embodiment, the drive input contacts 132 reside on the respective ends of the elongated plate 164, and the drive output contacts 126 reside on corresponding portions of the side walls of the locking chamber 172, when the elongated plate 164 is in the locking position. The counter and snap-fit connectors 130, 124 may be configured to ensure that the respective contacts 132, 126 are always connected in a predetermined way to avoid swapping signal and ground lines, which may represent the drive signals L+ and L−, respectively.

FIGS. 19 and 20 illustrate another embodiment wherein an LED luminaire 22 is attached directly to a front face of the drive adapter 122. In essence, the array of LEDs 38 is mounted on the front face and may be associated with a reflector and lens or globe assembly for controlling light output. The drive input contacts 132 are coupled to nodes on the respective ends of the array of LEDs 38. Notably, the drive adapter 122 has a counter snap-fit connector 130 like that described immediately above with respect to FIG. 16 through 18. In such a configuration, an LED luminaire 22 configured as an drive adapter 122 can be readily connected to the driver module 26, which has a compatible snap-fit connector 124, without the need for tools or connecting wires. Further, the connector configurations for the counter and snap-fit connectors 130, 124 (as well as 98, 92) may be swapped, as those in skilled in the art will appreciate.

Those skilled in the art will recognize improvements and modifications to the preferred embodiments of the present disclosure. All such improvements and modifications are considered within the scope of the concepts disclosed herein and the claims that follow.

What is claimed is:

1. A driver module assembly for at least one LED luminaire comprising:

a housing providing a cavity and having a first side comprising:
an AC snap-fit connector, which is configured to releasably attach to an AC counter snap-fit connector of an AC adapter, and
at least two AC input contacts, which are configured to receive AC input via the AC adapter; and
driver module electronics located within the cavity of the housing and configured to receive the AC input via the at least two AC input contacts, and generate at least one drive signal configured to drive the at least one LED luminaire.

2. The driver module assembly of claim 1 wherein the at least two AC input contacts are located outside of the AC snap-fit connector.

3. The driver module assembly of claim 1 wherein the at least two AC input contacts are located within the AC snap-fit connector.

4. The driver module assembly of claim 1 wherein a first of the at least two AC input contacts is located within the AC snap-fit connector and a second of the at least two AC input contacts is located outside of the AC snap-fit connector.

5. The driver module assembly of claim 1 further comprising a thermally conductive potting material substantially filling the cavity and substantially encapsulating the driver module electronics.

6. The driver module assembly of claim 1 wherein the at least one LED luminaire comprises:
a base;
a bulb coupled to a top of the base;
an LED mounting structure extending into the bulb; and
at least one LED responsive to the at least one drive signal and mounted on the LED mounting structure, wherein no driver electronics are provided in the at least one LED luminaire.

7. The driver module assembly of claim 1 wherein the AC snap-fit connector comprises an elongated slot, which leads to a locking chamber that is recessed into the first side, wherein the elongated slot is configured to allow an elongated plate that is spaced apart from a back side of the AC adapter by a central support to pass through the elongated slot and be received in the locking chamber, and the locking chamber is configured to allow the elongated plate to be rotated into a locking position within the locking chamber.

8. The driver module assembly of claim 7 wherein the at least two AC input contacts are located within the locking chamber.

9. The driver module assembly of claim 8 wherein the at least two AC input contacts are located on side walls of the locking chamber.

10. The driver module assembly of claim 8 wherein the at least two AC input contacts are located on opposing side walls of the locking chamber.

11. The driver module assembly of claim 8 wherein the locking chamber comprises at least one locking recess and the elongated plate has a recess that is configured to engage the at least one locking recess when the elongated plate is rotated into the locking position.

12. The driver module assembly of claim 8 wherein the locking chamber comprises at least one recess and the elongated plate has a locking recess that is configured to engage the at least one recess when the elongated plate is rotated into the locking position.

13. The driver module assembly of claim 1 wherein the housing has a second side comprising:
a drive snap-fit connector, which is configured to releasably attach to a drive counter snap-fit connector of a drive adapter;
at least two drive output contacts, which are configured to pass the at least one drive signal to the drive adapter; and
wherein the driver module electronics are configured to receive the AC input and generate the at least one drive signal.

14. The driver module assembly of claim 1 wherein one of the AC snap-fit connector and the AC counter snap-fit connector is a female connector and the other of the AC snap-fit connector and the AC counter snap-fit connector is a male connector, which is configured to slide into the female connector and snap into place such that the AC adapter is held in place against the first side and the at least two AC input contacts are held in contact with corresponding contacts on the AC adapter.

15. The driver module assembly of claim 1 further comprising the AC adapter which comprises:
a first portion having the AC counter snap-fit connector and at least two AC output contacts; and
a second portion comprising an AC input mechanism having at least two inputs, which are respectively electrically coupled to the at least two AC output contacts.

16. The driver module assembly of claim 15 wherein the AC input mechanism comprises an Edison-style base, wherein a thread contact of the Edison-style base is a first of the at least two inputs and a foot contact of the Edison-style base is a second of the at least two inputs.

17. The driver module assembly of claim 15 wherein the AC input mechanism comprises a GU-style base, wherein a first terminal of the GU-style base is a first of the at least two inputs and a second terminal of the GU-style base is a second of the at least two inputs.

18. The driver module assembly of claim 15 wherein the AC input mechanism comprises at least two wires extending from the second portion, wherein a first of the at least two wires is a first of the at least two inputs and a second of the at least two wires is a second of the at least two inputs.

19. The driver module assembly of claim 15 wherein the AC input mechanism comprises at least two screw terminals, wherein a first terminal of the at least two screw terminals is a first of the at least two inputs and a second terminal of the at least two screw terminals is a second of the at least two inputs.

20. The driver module assembly of claim 15 wherein the AC input mechanism comprises at least two spring terminals, wherein a first terminal of the at least two spring terminals is a first of the at least two inputs and a second terminal of the at least two spring terminals is a second of the at least two inputs.

21. A driver module assembly for at least one LED luminaire comprising:
a housing providing a cavity and having a first side comprising:
a snap-fit connector, which is configured to releasably attach to a counter snap-fit connector of a drive adapter, and
at least two drive output contacts, which are configured to pass at least one drive signal configured to drive the at least one LED luminaire to the drive adapter; and
driver module electronics located within the cavity of the housing and configured to receive an AC input and generate the at least one drive signal.

22. The driver module assembly of claim 21 wherein the at least two drive output contacts are located outside of the snap-fit connector.

23. The driver module assembly of claim 21 wherein the at least two drive output contacts are located within the snap-fit connector.

24. The driver module assembly of claim 21 wherein a first of the at least two drive output contacts is located within the snap-fit connector and a second of the at least two drive output contacts is located outside of the snap-fit connector.

25. The driver module assembly of claim 21 further comprising a thermally conductive potting material substantially filling the cavity and substantially encapsulating the driver module electronics.

26. The driver module assembly of claim 21 wherein the at least one LED luminaire comprises:
- a base;
- a bulb coupled to a top of the base;
- an LED mounting structure extending into the bulb; and
- at least one LED responsive to the at least one drive signal and mounted on the LED mounting structure, wherein no driver electronics are provided in the at least one LED luminaire.

27. The driver module assembly of claim 21 wherein one of the snap-fit connector and the counter snap-fit connector is a female connector and the other of the snap-fit connector and the counter snap-fit connector is a male connector, which is configured to slide into the female connector and snap into place such that the drive adapter is held in place against the first side and the at least two drive output contacts are held in contact with corresponding contacts on the drive adapter.

28. The driver module assembly of claim 21 further comprising the drive adapter which comprises:
- a first portion having the counter snap-fit connector and at least two drive input contacts; and
- a second portion comprising a drive output mechanism having at least two outputs, which are respectively electrically coupled to the at least two drive input contacts.

29. The driver module assembly of claim 28 wherein the drive output mechanism comprises at least two wires extending from the second portion, wherein a first of the at least two wires is a first of the at least two outputs and a second of the at least two wires is a second of the at least two outputs.

30. The driver module assembly of claim 29 wherein the drive adapter further comprises a mounting bracket.

31. The driver module assembly of claim 21 further comprising the drive adapter which comprises:
- a first portion having the counter snap-fit connector and at least two drive input contacts; and
- a second portion comprising an LED-based luminaire having at least two outputs, which are respectively electrically coupled to the at least two drive input contacts.

32. The driver module assembly of claim 21 wherein the snap-fit connector comprises an elongated slot, which leads to a locking chamber that is recessed into the first side, wherein the elongated slot is configured to allow an elongated plate that is spaced apart from a back side of the drive adapter by a central support to pass through the elongated slot and be received in the locking chamber, and the locking chamber is configured to allow the elongated plate to be rotated into a locking position within the locking chamber.

33. The driver module assembly of claim 32 wherein the at least two drive output contacts are located within the locking chamber.

34. The driver module assembly of claim 33 wherein the at least two drive output contacts are located on side walls of the locking chamber.

35. The driver module assembly of claim 33 wherein the at least two drive output contacts are located on opposing side walls of the locking chamber.

36. The driver module assembly of claim 33 wherein the locking chamber comprises at least one locking recess and the elongated plate has a recess that is configured to engage the at least one locking recess when the elongated plate is rotated into the locking position.

37. The driver module assembly of claim 33 wherein the locking chamber comprises at least one recess and the elongated plate has a locking recess that is configured to engage the at least one recess when the elongated plate is rotated into the locking position.

38. A driver module assembly for at least one LED luminaire comprising:
- a housing providing a cavity, wherein:
  - the housing has a first side comprising:
    - an AC snap-fit connector, which is configured to releasably attach to an AC counter snap-fit connector of an AC adapter; and
    - at least two AC input contacts, which are configured to receive AC input via the AC adapter; and
  - the housing has a second side comprising:
    - a drive snap-fit connector, which is configured to releasably attach to a drive counter snap-fit connector of a drive adapter; and
    - at least two drive output contacts, which are configured to pass at least one drive signal to the drive adapter;
- driver module electronics located within the cavity of the housing and configured to:
  - receive the AC input via the at least two AC input contacts;
  - generate at least one drive signal configured to drive the at least one LED luminaire; and
  - drive the at least one LED luminaire with the at least one drive signal; and
- a thermally conductive potting material substantially filling the cavity and substantially encapsulating the driver module electronics.

39. The driver module assembly of claim 38 wherein the at least one LED luminaire comprises:
- a base;
- a bulb coupled to a top of the base;
- an LED mounting structure extending into the bulb; and
- at least one LED responsive to the at least one drive signal and mounted on the LED mounting structure, wherein no driver electronics are provided in the at least one LED luminaire.

40. A system comprising:
- a driver module comprising:
  - a housing providing a cavity and having a first side comprising:
    - an AC snap-fit connector, which is configured to releasably attach to an AC counter snap-fit connector of an AC adapter, and
    - at least two AC input contacts, which are configured to receive AC input via the AC adapter; and
  - driver module electronics located within the cavity of the housing and configured to receive the AC input via the at least two AC input contacts, and generate at least one drive signal configured to drive at least one LED luminaire; and
at least one LED luminaire comprising:
a base;
a bulb coupled to a top of the base;
an LED mounting structure extending into the bulb; and
at least one LED responsive to the at least one drive signal and mounted on the LED mounting structure.

41. A driver module assembly for at least one LED luminaire comprising:
a housing providing a cavity and having at least two AC input points, at least two AC output points, and at least one drive output point, wherein each of the at least two AC input points is coupled to a corresponding one of the AC output points to provide an AC pass-through bus;
driver module electronics mounted within the cavity and configured to receive AC input via the at least two AC input points, and generate at least one drive signal configured to drive the at least one LED luminaire, wherein the at least one drive signal is provided to the at least one drive output point.

42. The driver module assembly of claim 41 wherein the housing has a first side comprising: an AC snap-fit connector, which is configured to releasably attach to an AC counter snap-fit connector of an AC adapter, and the at least two AC input points are AC input contacts, which are configured to receive the AC input via the AC adapter.

43. The driver module assembly of claim 42 wherein the housing has a second side comprising a drive snap-fit connector, which is configured to releasably attach to a drive counter snap-fit connector of a drive adapter, and the at least one drive output point is a drive contact.

44. The driver module assembly of claim 43 wherein the first side of the housing is on an opposite side of the housing as the second side.

45. The driver module assembly of claim 41 wherein the housing further comprises at least one drive input point and further comprising summing circuitry, which is configured to add a supplemental drive signal received via the at least one drive input point with the at least one drive signal to provide a summed drive signal, wherein the summed drive signal is provided to the at least one drive output point.

46. The driver module assembly of claim 41 further comprising a thermally conductive potting material substantially filling the cavity and substantially encapsulating the driver module electronics.

\* \* \* \* \*